United States Patent Office 3,738,850

Patented June 12, 1973

3,738,850

LITHOGRAPHIC PLATE DESENSITIZER FORMULATIONS

Eugene A. Radell, Frederick J. Rauner, and James F. Houle, Rochester, N.Y., assignors to Eastman Kodak Company, Rochester, N.Y.

No Drawing. Continuation-in-part of application Ser. No. 137,612, Apr. 26, 1971. This application Oct. 4, 1971, Ser. No. 186,396

Int. Cl. C09d *5/20;* C09k *3/00, 3/18*

U.S. Cl. 106—2 8 Claims

ABSTRACT OF THE DISCLOSURE

Lithographic plate desensitizer formulations based on hydrophilic colloids are improved by the addition of dialdehydes, and molybdate ions.

This application is a continuation-in-part of copending U.S. Ser. No. 137,612 filed Apr. 26, 1971.

This invention relates to lithography. In a particular aspect it relates to desensitizer formulations for processing lithographic printing plates.

In recent years there has been a rapid increase in the use of light-sensitive polymers and polymer compositions in the preparation of lithographic printing plates. A layer of the polymer composition is formed on a suitable lithographic support and is imagewise exposed to actinic radiation to effect a solubility difference between the exposed and unexposed areas of the layer. A polymeric image is developed by treatment with a solvent for the material in either the exposed or unexposed areas but is a nonsolvent for material in complementary areas. The action of the developer solvent uncovers the substrate, and by appropriate selection of the polymer composition and support, or by appropriate aftertreatment, there is obtained a lithographic printing plate having oleophilic image areas on a hydrophilic background.

After the printing plate has been exposed imagewise and developed, the non-image areas often are desensitized and made more hydrophilic by adding in the non-image areas a thin, tightly adhering, film of a water soluble, hydrophilic, film forming colloid, such as a gum. This hydrophilic film acts as a barrier to prevent ink from sensitizing the non-image areas of the plate and making them oleophilic. If the desensitizing formulation or desensitizer gum is improperly chosen or employed, problems can occur such as "scumming" where portions of the hydrophilic non-image areas become non-hydrophilic and accept ink, or "blinding" where portions of the oleophilic or printing areas become nonoleophilic, for example, by the adherence of the desensitizer gum thereto, and hence, do not accept the lithographic ink.

It is an object of this invention to provide novel desensitizer formulations for lithographic printing plates.

It is another object of this invention to improve the performance of lithographic printing plate desensitizer formulations.

It is yet another object of this invention to provide desensitizer formulations which permit repeated holdovers of lithographic printing plates without adversely affecting the plate.

It is a further object of this invention to provide processes for desensitizing lithographic printing plates so as to minimize scumming and blinding.

The above and other objects of this invention will become apparent to those skilled in the art from the further description of this invention which follows.

It has been found that by adding dialdehydes to desensitizer formulations for lithographic printing plates the desensitizers are improved in that there is less of a tendency for the plate to scum, either initially or after holdovers in a press run, and there is little tendency for ink to be transferred in non-printing areas of the plate, such as occurs with "blanket toning." Such improvements are obtained in particular with desensitizer formulations containing molybdate ions.

In accordance with the present invention, there is provided a novel desensitizer formulation for use with lithographic printing plates which comprises a water soluble, hydrophilic, film forming colloid, a dialdehyde and molybdate ions. Other addenda, as will be described more fully hereinafter, can be incorporated in the desensitizer formulations of the present invention. These formulations can be used with lithographic printing plates in general and are particularly useful with aluminum base lithographic printing plates prepared using light-sensitive polymeric compositions.

While not wishing to be bound to any particular theory as to the mechanism by which the dialdehyde improves the performance of the desensitizer formulation, it is believed that it involves a hardening of the hydrophilic colloid to improve its retention in the non-image areas of the printing plate, without reducing the hydrophilic character of the colloid. It is believed that such hardening results from the formation of a coacervate between the hydrophilic colloid and the dialdehyde.

The hydrophilic colloids generally employed in desensitizing solutions and which can be used in the formulations of the invention are water-soluble polymers, in particular water-soluble gums which contain carboxyl and hydroxyl groups. Gum arabic is the oldest and best known of the useful hydrophilic colloids and is preferred for use in the present formulations. Carboxymethyl cellulose, also known as cellulose gum, is widely used, although it is not as good a desensitizing agent on aluminum plates as is gum arabic. Another derivative of cellulose which can be used as a desensitizing gum is hydroxyethyl cellulose. Synthetic hydrophilic colloids, such as styrene-maleic anhydride copolymers, polyvinyl pyrrolidone, and the like, can be used as desensitizing gums. A typically useful range of colloid concentration is between about 1 and 30% by weight.

Dialdehydes having a wide range of molecular weights can be incorporated in the desensitizer formulations of the present invention. These include monomeric dialdehydes such as glyoxal and glutaraldehyde as well as water soluble polymeric dialdehydes such as water soluble dialdehyde polysaccharide derivatives. Dialdehyde polysaccharides can be represented by repeating units of the structural formula

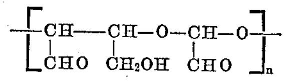

wherein $n$ is an integer from about 20 to several thousand. The water solubility of such dialdehyde polysaccharides can be increased by converting them to a bisulfite derivative as described in Borchert U.S. Pat. 3,098,869 issued July 23, 1963. A particularly suitable water soluble polymeric dialdehyde is sold by Miles Laboratories, Inc., Elkhart, Ind., under the trade name Dasol A and is described in Miles Laboratories Bulletin No. 22546–1, Dasol A, a Water Soluble Polymeric Dialdehyde, 1966. The amount of dialdehyde added to the desensitizer solution will vary depending upon the particular dialdehyde employed and the nature and amount of the ether components in the desensitizer. Typically, useful results are obtained when the dialdehyde comprises 0.25 percent to 5 percent by weight of the desensitizer solution.

Any suitable source of molybdate ions can be employed which does not contain cations which would interfere with the performance of the formulation. Useful sources of molybdate ions include molybdic acid and water-soluble molybdate salts such as alkali metal molybdate salts, e.g., sodium molybdate, potassium molybdate, etc., ammonium molybdate, magnesium molybdate, thallous molybdate, and the like. Useful results are obtained when as little as 0.01 percent by weight or less of molybdate ions is added to the formulation. The preferred concentration of molybdate ions in the formulation is between about 0.1 and 5.0 percent by weight; an especially preferred concentration range is about 0.5 to 1.0 percent by weight.

The desensitizer formulations are preferably employed as aqueous acidic solutions. It has been found that with acidic solutions there is better adhesion of the hydrophilic colloid to the substrate in non-printing areas of the plate. It is generally believed that this is due to the carboxylic acid groups on the hydrophilic colloid being in their free acid form, in which form they are more strongly absorbed to a metallic substrate. Phosphoric acid is a preferred acid for use in acidifying the formulation. Other acids which can be used include inorganic as well as organic acids, such as acetic acid, nitric acid, hydrochloric acid and the like. A buffering agent, such as ammonium acetate can also be included. Preferably the desensitizer formulations of the present inventions are maintained at a pH in the range of 2 to 5. The particular pH at which a given formulation is maintained will depend upon such factors as the hydrophilic colloid employed, other addenda which may be present in the formulation, the nature of the substrate employed in the lithographic printing plate, and the like.

Other addenda which are typically employed with desensitizing formulations, and which can be employed with the formulations of the present invention, include preservatives such as phenol, sodium salicylate, sodium benzoate, methylhydroxybenzoate, etc.; corrosion inhibitors such as ammonium bichromate, magnesium nitrate, zinc nitrate, etc., hardeners, such as chrom alum, etc.; organic solvents such as cyclic esters, e.g., 4-butyrolactone; and the like. These addenda can be present in the formulation in concentrations in the range of about 0.05 to about 5 percent by weight.

A particularly preferred class of addenda for use with the lithographic plate desensitizer formulations of the present invention are those which improve the spreadability of the formulation and assure good contact between the formulation and the hydrophilic substrate. Suitable such materials include polyhydric alcohols which have previously been employed as humectants and similar hygroscopic materials, such as glycerol, diethylene glycol, triethylene glycol, oligomeric poly(ethylene glycols), etc.; as well as wetting agents such as esters of inorganic acids such as phosphate esters of such alkanols as n-hexanol, n-octanol, n-decanol, etc., phosphate esters of such alkoxyalkanols as 2-n-octyloxyethanol, 2-n-decyloxyethanol, etc., mixtures of such phosphate esters, etc.; esters of organic acids such as the dioctyl ester of sodium sulfosuccinic acid; polyethers such as octyl phenoxy polyethoxyethanol, nonyl phenyl polyethylene glycol ether, etc.; and the like. Such materials are sold under such trademarks as "Zonyl A," "Triton X–35," "Triton X–45," "Triton X–100," "Surfynol 450," "Aerosol OT," "Tergitol 15," etc. The amount of these materials added to the composition will of course depend upon the particular agent employed and its characteristics. Typically they can be employed in the formulation in amounts of about from 0.1 to 10 percent by volume.

The desensitizers of the present invention are particularly useful with lithographic printing plate having coatings of such light-sensitive polymers as polyesters, polycarbonates and polysulfonates which contain the light-sensitive grouping $$—CH{=}CH—\overset{O}{\overset{\|}{C}}—$$

as an integral part of the polymer backbone. Polymers containing this light-sensitive grouping are described in U.S. Pats. 3,030,208 and 3,453,237, and U.S. application Ser. No. 709,496, filed Feb. 29, 1968. The polyesters can be prepared by condensing a suitable polycarboxylic acid, or the lower alkyl ester or chloride of a suitable polycarboxylic acid with a suitable polyhydric alcohol, in the presence of an esterification catalyst. The polycarbonates can be prepared by reaction of one or more polyhydric alcohols with phosgene, or by reaction of a bischloroformate of a polyhydric alcohol with another polyhydric alcohol. Typical polycarboxylic acids include p-phenylene diacrylic acid, fumaric acid, succinic acid, adipic acid, terephthalic acid, etc., and mixtures of these acids. Typical polyhydric alcohols include ethylene glycol, 1,3-propanediol, 1,6-hexanediol, neopentyl glycol, 1,4-cyclohexanedimethanol, 1,4 - di - β-hydroxyethoxycyclohexane, diphenylol propane, tetrachloro-diphenylolpropane, dihydroxychalcones and dihydroxy dibenzal ketones such as divanillal cyclopentanone, 4,4′-dihydroxychalcone, etc., as well as mixtures of these diols.

Other printing plates with which the formulations of the present invention are particularly useful are those prepared from a light-sensitive coating of a suitably stabilized water-soluble resin containing the diazonium group. Such printing plates are described in U.S. Pat. 3,342,601.

The above light-sensitive polymers are negative working; that is, coatings of these polymers harden or become more insoluble in areas exposed to actinic radiation, thus giving a negative polymeric image of the image through which they are exposed. The formulations of the present invention can also be used with lithographic printing plates derived from positive-working polymers. Typical of lithographic printing plates employing positive working polymers are those described in commonly assigned Rauner et al. U.S. application Ser. No. 72,896 filed Sept. 16, 1970, which have attached to a polymeric moiety the following light-sensitive units:

$$—\overset{R}{\overset{|}{N}}—X—D$$

wherein R is a hydrogen atom or a lower alkyl group, e.g., an alkyl group having 1–4 carbon atoms, X represents a sulfonyl ($—SO_2—$), carbonyl $$\left(—\overset{O}{\overset{\|}{C}}—\right)$$

or the like group, and D represents a quinone diazide group. Polymers to which these units can be attached include homo or copolymers containing a reactive nitrogen atom and can be either condensation of addition polymers. Suitable addition polymers are those containing a reactive nitrogen and include aminostyrenes, polyvinyl amines, polyaminoalkyl acrylamides, aniline substituted polyacrylic acid amides, polyvinyl anthranilates as well as amino containing heterocyclic nuclei polymers such as polymeric amino triazoles. Suitable condensation type polymers having a free reactive nitrogen include aniline formaldehyde type polymers wherein aniline and formaldehyde are condensed under strong acid conditions as described on page 280 of Golding, "Polymers and Resins," D. Van Nostrand, New York, 1959. Coating compositions generally combine at least one of these positive-working light-sensitive polymers with a different film-forming resin, such as a phenol-aldehyde resin of the novolac or resole type, e.g., phenolformaldehyde and cresol-formaldehyde resins. Other positive-working lithographic printing plates are described in U.S. Pat. 3,515,555 and commonly assigned Rauner et al. U.S. application Ser. No. 857,587, filed Sept. 12, 1969.

Supports on which a layer of the light-sensitive polymer is coated to prepared lithographic printing plates can be selected from any of the standard lithographic supports and include sheets and plates of such metals as aluminum, anodized aluminum, copper, zinc, etc., paper, polymeric coated paper, synthetic resins, and the like. The support is often subbed with a coating which improves adhesion of the light-sensitive polymer and increases the hydrophilic properties of the background areas of the printing plate. Particularly useful supports are the aluminum supports described in U.S. Pats. 3,342,601 and 3,511,661.

The formulations of the present invention are placed on the printing plate by conventional techniques used in the trade such as swabbing and the like. Plates can be processed in a sink or on a clean dry surface. In a typical procedure, after development of the plate, the desensitizer gum is applied generously with a cotton pad, using light pressure and a stroking pattern. About one-half minute is required for the treatment of a 16 by 20-inch plate. Enough desensitizer gum is used to remove all traces of developer. A soft rubber squeegee may be used to remove excess desensitizer gum and insure complete removal of developer from the plate, after which a fresh application of the desensitizer gum is made and the plate is ready for inking and printing.

The following examples further illustrate the invention.

EXAMPLE 1

Desensitizer gum solutions are prepared having the following composition:

SOLUTION A

| | | |
|---|---|---|
| Gum arabic 10° Bé | cc | 1000.00 |
| Sodium molybdate | g | 5.00 |
| Wetting agent (Zonyl A, a modified aliphatic ethylene oxide condensate, sold by Du Pont) | cc | 1.25 |
| Phosphoric acid (85%) | cc | 10.00 |
| Glycerine | cc | 40.00 |

To portions of this control desensitizer varying amounts of glyoxal are added as indicated in the below table. Lithographic printing plates are prepared by whirl coating anodized aluminum plates with a light-sensitive polymer composition having the following formulation:

| | | |
|---|---|---|
| Light sensitive polyester prepared by condensing 100 mole percent p-phenylenediethoxyacrylate with 100 mole percent 1,4-$\beta$-hydroxyethoxycyclohexane | g | 4.0 |
| (2-benzoylmethylene)-1-methyl-$\beta$-naphthothiazoline | g | 0.32 |
| Butylated hydroxytoluene | g | 0.08 |
| Benzoic acid | g | 0.16 |
| Hydroquinone | g | 0.08 |
| Monochlorobenzene | cc | 100.00 |
| Pigment (Heliogen Blue K, C. I. Pigment Blue 15) | g | 0.08 |

The plates are dried, exposed to insolubilizing radiation through a negative and developed by swabbing with the following developer composition:

| | | |
|---|---|---|
| 4-butyrolactone | cc | 500.0 |
| Triethanolamine | cc | 50.0 |
| Glycerol | cc | 50.0 |
| Methyl abietate | cc | 5.0 |
| Hydrogenated wood rosin (Staybelite Resin, sold by Hercules Powder Co.) | | 0.5 |
| Wetting agent (Zonyl A, a modified aliphatic ethylene oxide condensate, sold by Du Pont) | cc | 4.5 |

The plates are desensitized with the desensitizer formulations described above and 500 impressions are made with each plate using a greasy lithographic ink. The press is then stopped, the plates are given a full charge of ink, and the inked plates are held on the press for ten minutes before the press is restarted. No difficulty in restarting is encountered the first few times such holdovers take place. However, as this sequence is repeated a number of times the background areas begin to scum, rendering the plate undesirable. The following table shows the number of holds until background scum first occurs for plates having been treated with both the control desensitizer solution and the modified desensitizers. The percentages of the dialdehyde shown in this and the subsequent table is weight percent based on the total volume of the desensitizer composition.

| Desensitizer | Holds until scumming occurs | Background scum density after 26 holds |
|---|---|---|
| Solution A (control) | 6 | 0.29 |
| Solution A plus 0.5% glyoxal | 7 | 0.22 |
| Solution A plus 1% glyoxal | 12 | 0.00 |
| Solution A plus 2% glyoxal | 21 | 0.00 |

This illustrates that the presence of glycol in the desensitizer solution markedly improves the holdover characteristics of the lithographic plates. Similar improvement results when glutaraldehyde is substituted for glyoxal.

EXAMPLE 2

Printing plates prepared and developed as described in Example 1 are tested by the same procedure employed therein using the following desensitizer solution.

SOLUTION B

| | | |
|---|---|---|
| Distilled water | cc | 1000.0 |
| Gum arabic powder | g | 150.0 |
| Sodium molybdate | g | 3.0 |
| Wetting agent (Triton X-100, octylphenoxy ethanol sold by Rohm and Haas Co.) | cc | 0.2 |
| Sodium benzoate | g | 1.2 |
| Phosphoric acid (85%) | cc | 10.0 |

To portions of this control desensitizer there is added varying amounts of a water soluble polyaldehyde which is an oxidation product of starch with periodic acid and is sold under the trade name "Dasol A" by Miles Laboratories. The results obtained are shown in the following table.

| Desensitizer | Holds until scumming occurs | Background scum density after 26 holds |
|---|---|---|
| Solution B (control) | 9 | 0.41 |
| Solution B plus 0.4% Dasol A | 20 | 0.01 |
| Solution B plus 1% Dasol A | 21 | 0.01 |

This data shows that the presence of Dasol A reduces the tendency toward scumming during holdover operations.

The invention has been described in detail with particular reference to preferred embodiments thereof, but it will be understood that variations and modifications can be effected within the spirit and scope of the invention.

What is claimed is:

1. A desensitizer formulation for a lithographic printing plate which comprises an aqueous acidic solution having a pH of from 2 to 5 of from 1 to 30 percent by weight of a water soluble, hydrophilic, film-forming colloid, from 0.25 to 5 percent by weight of a dialdehyde and from 0.01 to 5 percent by weight of molybdate ions.

2. A formulation as defined in claim 1 wherein the dialdehyde is a water soluble polymeric dialdehyde.

3. A formulation as defined in claim 1 wherein the dialdehyde is glyoxal.

4. A formulation as defined in claim 3 wherein the hydrophilic colloid is gum arabic.

5. A formulation as defined by claim 3 further comprising from 0.1 to 10 percent by volume of a wetting agent.

6. A desensitizer formulation for a lithographic printing plate as defined by claim 2 comprising an aqueous solution, acidified to a pH of 2 to 5 with phosphoric acid, of gum arabic, glyoxal and sodium molybdate.

7. A desensitizer formulation as defined by claim 6 further comprising from 0.1 to 10 percent by volume of a polyether wetting agent.

8. A desensitizer formulation as defined by claim 6 further comprising from 0.1 to 10 percent by volume of glycerol.

References Cited

UNITED STATES PATENTS

| | | | |
|---|---|---|---|
| 2,515,536 | 7/1950 | Van Dusen | 106—2 |
| 3,276,361 | 10/1966 | Abbott et al. | 96—33 X |
| 3,398,002 | 8/1968 | Bondurant et al. | 101—451 X |
| 3,687,694 | 8/1972 | Van Dusen | 106—2 |

DAVID KLEIN, Primary Examiner

U.S. Cl. X.R.

96—33; 101—451, 465